(12) United States Patent
Azenkot

(10) Patent No.: US 8,619,897 B2
(45) Date of Patent: Dec. 31, 2013

(54) METHOD AND APPARATUS OF FREQUENCY DOMAIN ECHO CANCELLER

(75) Inventor: Yehuda Azenkot, San Jose, CA (US)

(73) Assignee: Netlogic Microsystems, Inc., Irvine, CA (US)

( * ) Notice: Subject to any disclaimer, the term of this patent is extended or adjusted under 35 U.S.C. 154(b) by 1252 days.

(21) Appl. No.: 12/331,310

(22) Filed: Dec. 9, 2008

(65) Prior Publication Data

US 2010/0142604 A1    Jun. 10, 2010

(51) Int. Cl.
*H04B 15/00* (2006.01)

(52) U.S. Cl.
USPC ............ 375/285; 367/45; 370/290; 375/232; 379/381; 379/406.09; 379/390.02; 381/71.12

(58) Field of Classification Search
None
See application file for complete search history.

(56) References Cited

U.S. PATENT DOCUMENTS

| | | | |
|---|---|---|---|
| 4,074,086 A | 2/1978 | Falconer et al. |
| 4,439,639 A | 3/1984 | Munter |
| 4,577,329 A | 3/1986 | Brie et al. |
| 4,918,685 A | 4/1990 | Tol et al. |
| 4,977,591 A | 12/1990 | Chen et al. |
| 5,347,539 A | 9/1994 | Sridhar et al. |
| 5,744,385 A | 4/1998 | Hojabri |
| 5,880,634 A | 3/1999 | Babanezhad |
| 5,936,445 A | 8/1999 | Babanezhad |
| 6,028,479 A | 2/2000 | Babanezhad |
| 6,069,505 A | 5/2000 | Babanezhad |
| 6,169,764 B1 | 1/2001 | Babanezhad |
| 6,256,157 B1 | 7/2001 | Biskeborn et al. |
| 6,266,367 B1 | 7/2001 | Strait |
| 6,600,775 B2 | 7/2003 | Sutterlin et al. |
| 6,693,975 B2 | 2/2004 | Halder |
| 6,778,599 B1 | 8/2004 | Doron |
| 6,795,494 B1 | 9/2004 | Phanse et al. |
| 6,909,742 B1 | 6/2005 | Leonosky |
| 6,928,110 B2 | 8/2005 | Ougo et al. |
| 6,958,549 B2 | 10/2005 | Wakitani et al. |
| 6,985,549 B1 | 1/2006 | Biracree et al. |
| 6,990,163 B2 | 1/2006 | Williams |
| 7,171,436 B2 | 1/2007 | Egelmeers et al. |
| 7,471,904 B2 | 12/2008 | Kaneda et al. |

(Continued)

FOREIGN PATENT DOCUMENTS

EP    0 301 636 A1    2/1989
WO    2008/112328    9/2008

OTHER PUBLICATIONS

USPTO Office Action dated Nov. 23, 2009, in the patent application entitled "Joint Phased Training of Equalizer and Echo Canceller", with U.S. Appl. No. 11/724,816, filed Mar. 15, 2007.

(Continued)

*Primary Examiner* — Adolf Dsouza
(74) *Attorney, Agent, or Firm* — Sterne, Kessler, Goldstein & Fox P.L.L.C.

(57) ABSTRACT

A frequency-domain based echo and NEXT canceller is provided. The canceller uses $\log_2$ encoding to precondition the error signal representing the echo. An improved gradient constraint is applied on at least a portion of a full weight vector in a least-mean-square algorithm. The least-mean-square algorithm is used to compute filter coefficients. The filter coefficients are multiplied by a frequency-domain data vector using a frequency-domain multiplier to generate frequency-domain output vector.

60 Claims, 11 Drawing Sheets

(56) References Cited

U.S. PATENT DOCUMENTS

| | | | |
|---|---|---|---|
| 7,483,479 B2 | 1/2009 | Callicotte et al. | |
| 7,535,956 B2 | 5/2009 | Yamaguchi | |
| 7,561,619 B2 | 7/2009 | Asuri et al. | |
| 7,656,981 B2 | 2/2010 | Stojanovic et al. | |
| 7,839,758 B1 | 11/2010 | Gregorian et al. | 370/201 |
| 7,843,859 B1 | 11/2010 | Gregorian et al. | 370/290 |
| 7,849,348 B1 | 12/2010 | Sidiropoulos et al. | |
| 8,040,943 B1 | 10/2011 | Babanezhad | 375/229 |
| 8,054,873 B2 | 11/2011 | Babanezhad | 375/229 |
| 8,064,510 B1 | 11/2011 | Babanezhad | 375/232 |
| 2002/0181633 A1* | 12/2002 | Trans | 375/354 |
| 2003/0072363 A1 | 4/2003 | McDonald et al. | |
| 2003/0235245 A1 | 12/2003 | Edrogan et al. | |
| 2004/0095994 A1 | 5/2004 | Dowling | |
| 2005/0019042 A1 | 1/2005 | Kaneda et al. | |
| 2005/0094583 A1 | 5/2005 | Gupta et al. | |
| 2006/0262686 A1 | 11/2006 | Wu | |
| 2007/0237270 A1* | 10/2007 | Mezer et al. | 375/346 |
| 2007/0280388 A1* | 12/2007 | Torre et al. | 375/350 |
| 2008/0080598 A1 | 4/2008 | Mo et al. | |
| 2008/0224793 A1 | 9/2008 | Babanezhad | 375/229 |
| 2009/0003372 A1 | 1/2009 | Popper et al. | |
| 2010/0142604 A1 | 6/2010 | Azenkot | |

OTHER PUBLICATIONS

USPTO Office Action dated Jun. 14, 2010, in the patent application entitled "Joint Phased Training of Equalizer and Echo Canceller", with U.S. Appl. No. 11/724,816, filed Mar. 15, 2007.

USPTO Office Action dated Nov. 17, 2010, in the patent application entitled "Joint Phased Training of Equalizer and Echo Canceller", with U.S. Appl. No. 11/724,816, filed Mar. 15, 2007.

USPTO Office Action dated Mar. 17, 2010, in the patent application entitled "New Least Mean Square (LMS) Engine for Multilevel Signal", with U.S. Appl. No. 11/724,817, filed Mar. 15, 2007.

USPTO Office Action dated Oct. 20, 2010, in the patent application entitled "New Least Mean Square (LMS) Engine for Multilevel Signal", with U.S. Appl. No. 11/724,817, filed Mar. 15, 2007.

USPTO Office Action dated Apr. 1, 2010, in the patent application entitled "Analog Encoder Based Slicer", with U.S. Appl. No. 11/724,881, filed Mar. 15, 2007.

USPTO Office Action dated Nov. 3, 2010, in the patent application entitled "Analog Encoder Based Slicer", with U.S. Appl. No. 11/724,881, filed Mar. 15, 2007.

J.J. Shynk, "Frequency-domain and multirate adaptive filtering", IEEE Signal Processing Mag., Jan. 1992, pp. 14-37.

Derkx, R. M. M., et al., "New Constraining Method for Partitioned Block Frequency-Domain Adaptive Filters," IEEE Transactions on Signal Processing, vol. 50, No. 9, Sep. 2002; pp. 2177-2186.

Erdogan, A., et al., "Efficient Implementation of Echo Canceller for Applications with Asymmetric Rates," Proceedings for the 2003 IEEE International Conference on Acoustics, Speech, and Signal Processing (ICASSP '03), vol. 6, Apr. 6-10, 2003; pp. VI-233 to VI-236.

"IEEE 802 10GBASE-T Tutorial," Nov. 10, 2003; pp. 1-56.

Joho, M., et al., "Connecting Partitioned Frequency-Domain Filters Parallel or in Cascade," IEE Transactions on Circuits and Systems II: Analog and Digital Signal Processing, vol. 47, No. 8, Aug. 2000; pp. 685-698.

Lin, X. S., et al., "Frequency-Domain Adaptive Algorithm for Network Echo Cancellation in VoIP," EURASIP Journal on Audio, Speech, and Music Processing, 2008; pp. 1-9.

Proakis, J. G., "Digital Communications," Fourth Education, McGraw-Hill Higher Education, 2001; p. 662.

Sedra, A. S., et al., "Microelectronic Circuits," Fourth Edition, Oxford University Press, 1998; pp. 14-15.

Smolka, G. J., "Analog CMOS Circuits for ISDN," IEEE Symposium on Circuits and Systems, 1988; pp. 1927-1930.

Soo, J.-S., et al., "Multidelay Block Frequency-Domain Adaptive Filter," IEEE Transactions on Acoustics, Speech, and Signal Processing, vol. 38, No. 2, Feb. 1990; pp. 373-376.

Widrow, B., et al., "Adaptive Antenna Systems," Proceedings of the IEEE, vol. 55, No. 12, Dec. 1967; pp. 2143-2159.

International Search Report directed to related International Patent Application No. PCT/US2008/003625, mailed Aug. 5, 2008, from the European Patent Office; 4 pages.

International Preliminary Report on Patentability and the Written Opinion of the International Searching Authority directed to related International Patent Application No. PCT/US2008/003625, mailed Sep. 15, 2009, from the International Bureau of WIPO; 9 pages.

Notice of Allowance mailed Mar. 31, 2011 for U.S. Appl. No. 11/724,816, filed Mar. 15, 2007; 5 pages.

Notice of Allowance mailed Jun. 30, 2011 for U.S. Appl. No. 11/724,816, filed Mar. 15, 2007; 5 pages.

Notice of Allowance mailed Jun. 14, 2011 for U.S. Appl. No. 11/724,817, filed Mar. 15, 2007; 7 pages.

Notice of Allowance mailed Mar. 31, 2011 for U.S. Appl. No. 11/724,881, filed Mar. 15, 2007; 5 pages.

Non-Final Rejection mailed Jun. 8, 2011 for U.S. Appl. No. 11/724,881, filed Mar. 15, 2007; 20 pages.

Notice of Allowance mailed Sep. 22, 2011 for U.S. Appl. No. 11/724,881, filed Mar. 15, 2007; 5 pages.

Non-Final Rejection mailed Mar. 23, 2012 for U.S. Appl. No. 12/406,025, filed Mar. 17, 2009; 12 pages.

* cited by examiner

METHOD AND APPARATUS OF FREQUENCY DOMAIN ECHO CANCELLER

FIELD OF THE INVENTION

The present invention relates to a method and apparatus to cancel echo in and near-end crosstalk (NEXT) in communication channels using frequency domain techniques.

BACKGROUND

When a transmitter in a communication system transmits data to a receiver, undesired high power replica data is generated by the transmitter. This replica data is called an echo. When an echo is received by the local receiver, it may cause corruption to the overall communication system. Cancelling these echo signals is highly desired for clearer communication. Another form of interference is NEXT. NEXT is caused by signals in neighboring communication links onto a receiver. Cancelling NEXT signals is also highly desired too. Echo cancellation involves first recognizing the originally transmitted signal that re-appears in the communication link with some delay in the transmitted or received signal. Once the echo is recognized, it is removed by subtracting it from the transmitted or received signal. The echo is recognized by identifying weight coefficients of the echo signal that in turn requires signal processing techniques.

The most common technique to cancel echo is to use adaptive Finite Impulse Responses Filters (FIR) implementing Fast Fourier Transformation (FFT) algorithms and gradient correlation. FIG. 1 shows a traditional echo cancelling architecture. Since the frequency-domain adaptive algorithms inherently perform circular convolution, adaptive filters usually require gradient constraints (GC) in the least-means-square (LMS) procedure. LMS algorithm is a well known algorithm to estimate coefficients of an error signal. A person of ordinary skill in the art may realize that circular convolution generates elements that correspond to a subset of linear convolution. Thus, techniques like overlap-save and overlap-add may be used for performing linear convolution. However, these signal processing techniques are computation heavy and require extensive hardware and clock cycles to compute echo coefficients.

SUMMARY OF THE INVENTION

One embodiment of the present invention discloses a frequency-domain echo canceller comprising: an error processing unit to transform a time-domain (TD) error signal into a frequency-domain (FD) error signal; a gradient constraint unit operable to process at least a portion of a full weight vector; a least-mean-square (LMS) adaptation unit, coupled with the error processing unit and an output of the gradient constraint unit, to compute filter coefficients; a FD multiplier to multiply a FD input signal and the full weight vector to generate a FD output signal; and an output processing unit to transform the FD output signal to a TD output signal.

Another embodiment of the present invention discloses a method to cancel echo in a communication system comprising: applying LMS adaptation algorithm, via an LMS adaptation unit, to a FD error signal to generate a scaled FD gradient vector corresponding to coefficients of the FD error signal; applying gradient constraint, via a gradient constraint unit coupled with the LMS adaptation unit, on at least a portion of a full weight vector of the scaled FD gradient vector to generate a FD gradient constraint vector; and multiplying the FD gradient constraint vector with a FD input signal by a shifting algorithm to generate a FD output signal with cancelled echo.

One embodiment of the present invention discloses a communication system with adaptive error correction comprising: an adaptive FD canceller with a gradient constraint unit operable to apply gradient constraint on at least a portion of a full weight vector; and a delay compensation unit to cancel an FD delay from the adaptive FD canceller.

One embodiment of the present invention discloses a frequency-domain echo canceller comprising: a gradient constraint unit to process at least a portion of a full weight vector; and a LMS adaptation unit, coupled with the gradient constraint unit, to compute filter coefficients based on the processed full weight vector.

In another embodiment of the present invention, a frequency-domain echo canceller comprises: a gradient constraint unit to process at least a portion of a sum of scaled gradient vectors; and a LMS adaptation unit, coupled with the gradient constraint unit, to compute filter coefficients based on the sum of the scaled gradient vectors.

BRIEF DESCRIPTION OF THE DRAWINGS

The present invention will be understood more fully from the detailed description given below and from the accompanying drawings of various embodiments of the invention, which, however, should not be taken to limit the invention to the specific embodiments, but are for explanation and understanding only.

DETAILED DESCRIPTION

The embodiments discussed herein generally relate to a method, system and apparatus for an improved frequency-domain echo and NEXT (FDEN) canceller. Referring to the figures, exemplary embodiments are described. The exemplary embodiments are provided to illustrate the embodiments and should not be construed as limiting the scope of the embodiments.

Reference in the specification to "an embodiment," "one embodiment," "some embodiments," or "other embodiments" means that a particular feature, structure, or characteristic described in connection with the embodiments is included in at least some embodiments, but not necessarily all embodiments. The various appearances of "an embodiment," "one embodiment," or "some embodiments" are not necessarily all referring to the same embodiments. If the specification states a component, feature, structure, or characteristic "may", "might", or "could" be included, that particular component, feature, structure, or characteristic is not required to be included. If the specification or claim refers to "a" or "an" element, that does not mean there is only one of the element. If the specification or claims refer to "an additional" element, that does not preclude there being more than one of the additional element.

The frequency-domain architecture requires less computational complexity relative to time-domain implementations. Linear convolution, rather than circular convolution, can be implemented via Fast Fourier Transform (FFT) using two prevalent methods: overlap-save and overlap-add. In one embodiment, the overlap-add method with overlap of 50% is used. The implementation complexity may be reduced as the block size increases. However, larger blocks may increase latency. In one embodiment, an FFT block size of N=128 samples is used.

In one embodiment, the overlap-add method based FDEN cancellers are composed of two functions: data path filtering and coefficient adaptation. In one embodiment, a filter size M is equal to the data size N. Given the 50% overlap, a 2N size FFT may be used. In one embodiment, the input and the output signals are time-domain signals and the error is computed in time-domain. As a result, the FDEN cancellers can be considered as a drop-in replacement for the time-domain implementation keeping the interface intact, except for the additional delay block that is used at the transmitter path to compensate for the frequency-domain block delays in the FDEN canceller. In one embodiment, the compensation delay is not be added to the receiver path in a communication system because the compensation delay may cause additional delay in the clock data recovery (CDR) loop.

Figure 1:
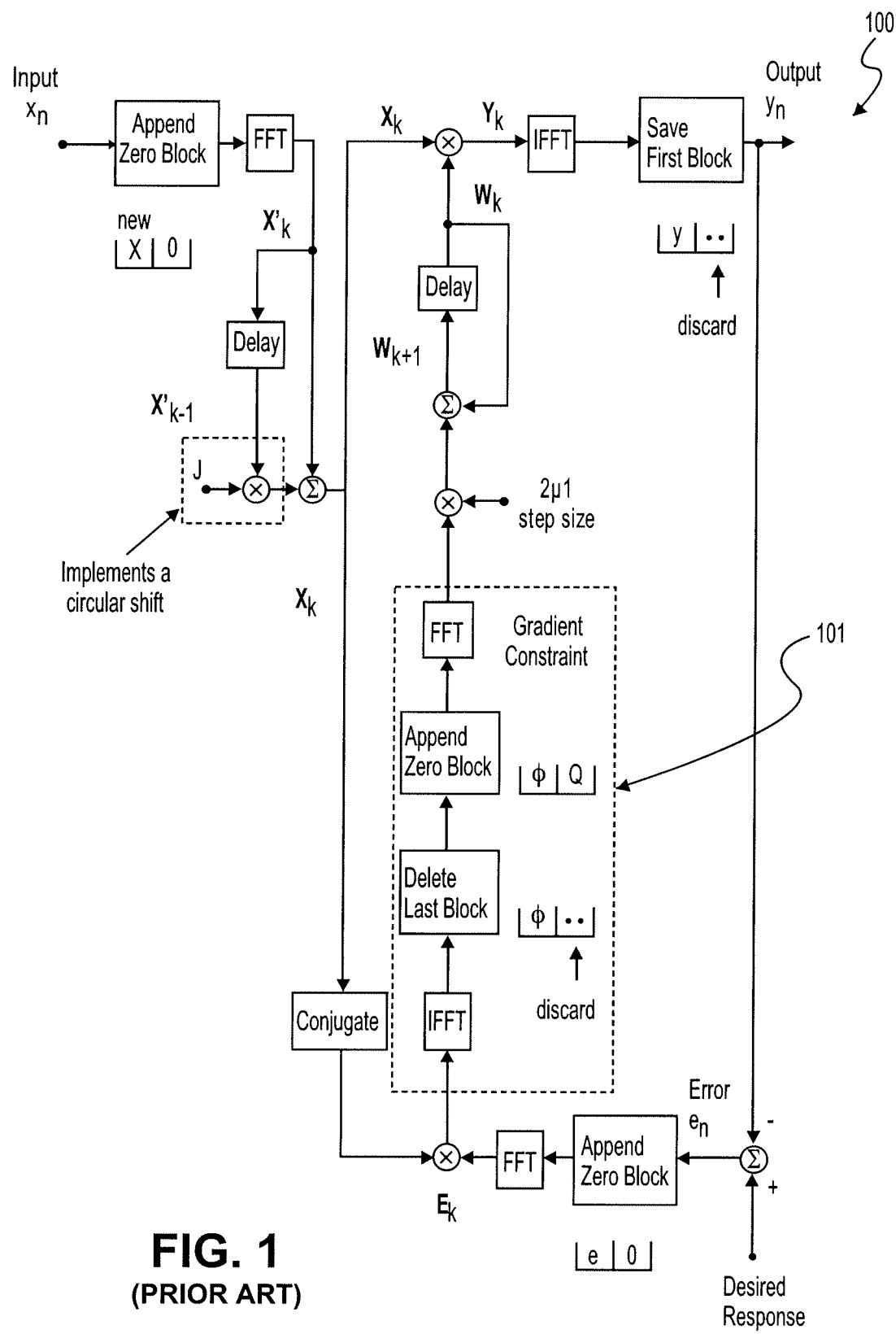
FIG. 1 is a prior art echo canceller using traditional gradient constraint in an overlap-save based frequency-domain adaptive filter.
Figure 2:
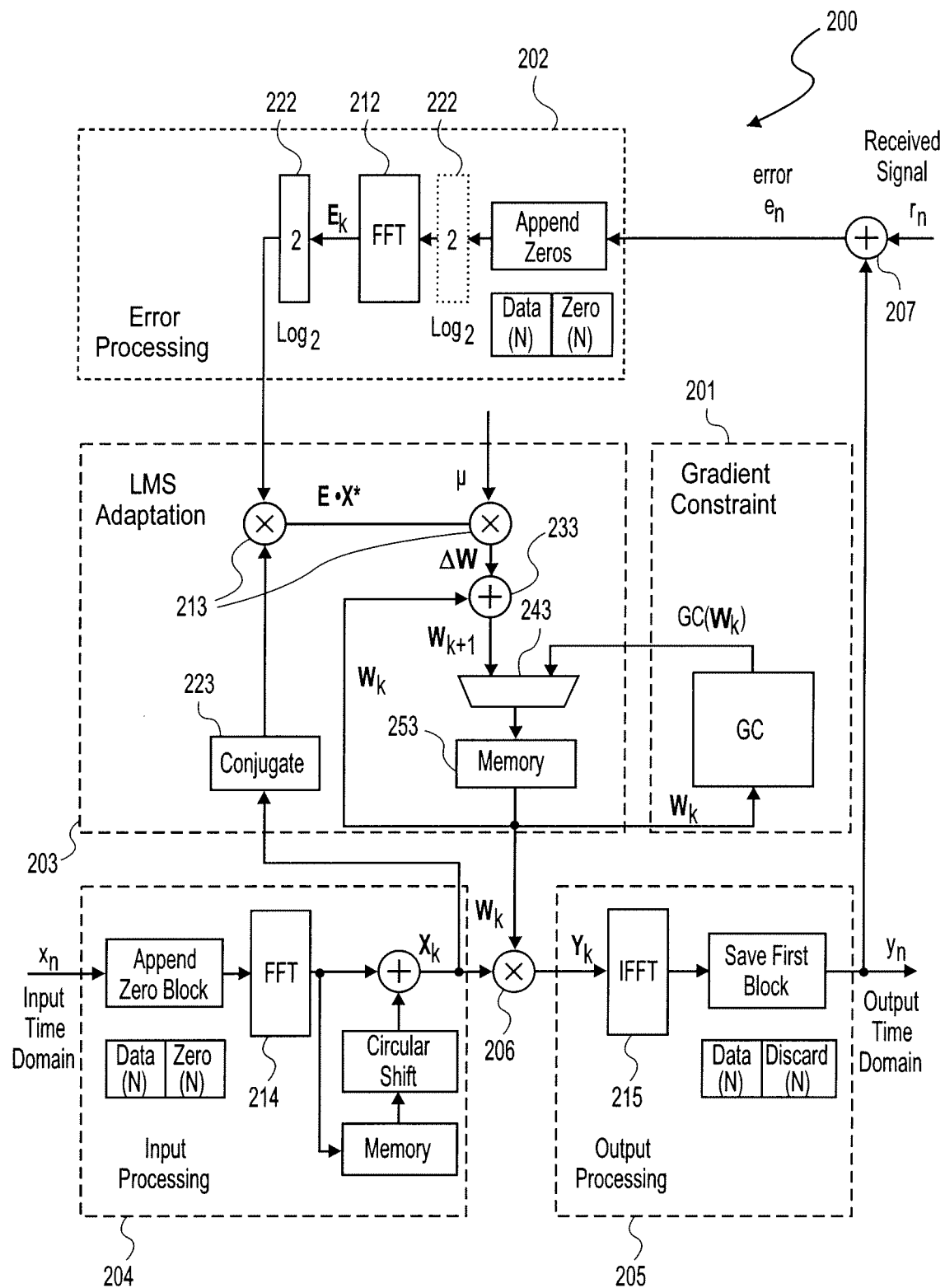
FIG. 2 is a frequency-domain echo/NEXT canceller according to one embodiment of the present invention.

As shown in FIG. 2, the overlap-add based FDEN architecture 200 is decomposed into the five sub-functional blocks: input processing 204, output processing 205, error processing 202, LMS adaptation engine 203, and gradient constraint 201. Of course, there is the frequency-domain filtering, which is achieved by multiplying (using multiplier 206) the frequency-domain coefficients with the frequency-domain data. Also, there may be the time-domain error computation. For purposes herein, the error $e_n$ may be defined as a subtraction of the canceller output $y_n$ from the received signal $r_n$:

$$e_n = r_n - y_n$$

Figure 7:
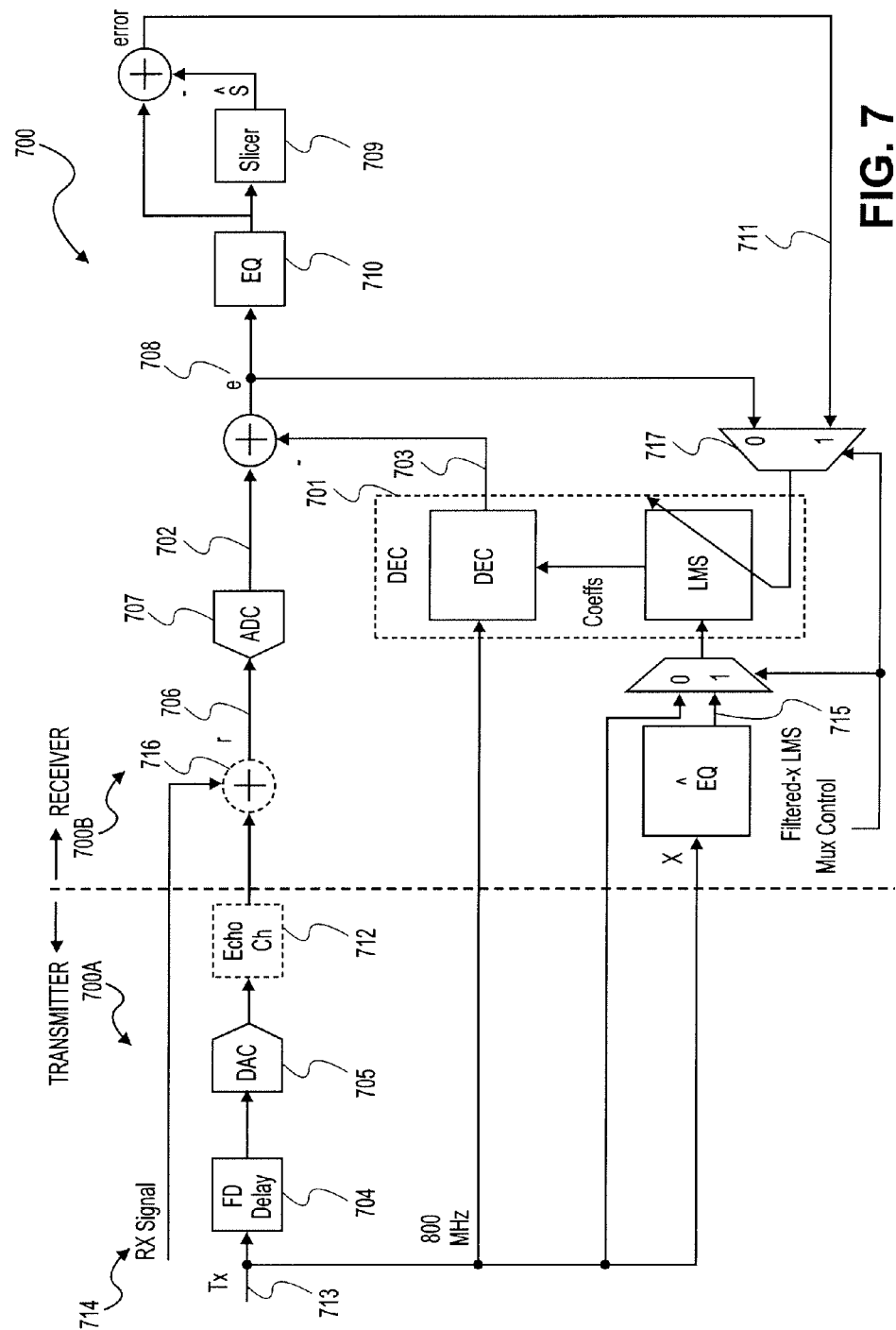
FIG. 7 is a frequency-domain echo/NEXT canceller integrated in a communication system according to one embodiment of the present invention.

FIG. 7 shows a FDEN 701 integrated in a communication system 700. The system 700 comprises a transmitter section 700A and a receiver section 700B. The transmitter section 700A is a simplified section to illustrate, in one embodiment, the need for the frequency-domain delay unit 704 before the digital transmit signal is converted into an analog signal by the Digital-to-Analog converter (DAC) 705. The echo block 712 represents the echo generated by the channel. This echo shows up in the analog receive signal 706 when it is added with receive signal 714 by a hypothetical adder 716 that represents how echo is imposed onto the receive signal 714.

The FDEN canceller 701 has inherent delay. Thus, the receive (Rx) echo signal 706 or, equivalently, the transmit (Tx) signal 713 may be delayed. The frequency-domain delay compensation unit 704 corresponds to an equivalent frequency-domain delay of the FDEN canceller 701 to compensate for the inherent delay. Placing an equivalent delay at the receiver side 700B of the communication system 700 after the Analog-to-Digital Converter (ADC) 701 may affect the CDR loop (not shown) negatively.

In one embodiment, the error signal 708 at the equalizer 710 (EQ) input is used as a starting point for the FDEN canceller 701 and later optionally switched to error signal 711 from the slicer block 709 once the EQ 710 converges. In such an embodiment, when FDEN switches to error signal 711, the FDEN 701 needs the filtered-x LMS signal 715 because the error is affected by the equalizer filtering. The error 708 is the difference between the output signal 703, of the FDEN 701, and the received digital signal 702. In one embodiment, the FDEN 701 no longer needs to wire the EQ coefficients for the filtered-x LMS.

Referring back to FIG. 2, the input processing block 204 transforms the time-domain input $x_n$ into frequency-domain data needed for the overlap-add method. In one embodiment, the input processing block 204 performs the following functions: accumulate N samples of the time-domain input samples; construct a 2N data vector from N data vector by appending N zeros to the input data vector; perform at 2N FFT (214) on the 2N data vector; and compute the final frequency-domain data vector by adding circularly shifted version of the previous FFT output block. A person skilled in the art may note that the circular shift of the transformed data vector can be achieved by multiplying the elements by alternating +/−1. The resulting frequency-domain data vector is represented by $X_k$ and has size 2N, as shown in FIG. 2. In one embodiment, $X_k$ is symmetric because $x_n$ is real, where $x_n$ is the time-domain signal. Thus, the input processing block 204 takes N samples of a time-domain signal $x_n$ and yields a 2N size frequency-domain vector $X_k$.

In one embodiment, the output processing block 205 transforms the frequency-domain input $Y_k$ into time-domain data $y_n$ that matches the linear convolution. The output processing block 205 performs a 2N Inverse Fast Fourier Transform (IFFT) 215 on the 2N frequency-domain output vector $Y_k$ to obtain the time-domain samples. The frequency-domain output vector $Y_k$ is generated as a result of multiplying the frequency-domain vector $X_k$ by the coefficient vector $W_k$ from the LMS adaptation block 203 (discussed below). The output processing block 205 also discards the last N samples and retains the first N samples as they match the linear convolution result using the save first block. The output of the output processing block 205 is the time-domain signal $y_n$. $y_n$ is then subtracted from a received time-domain signal $r_n$ to produce a time-domain error signal $e_n$. In one embodiment, the subtraction operation by 207 is performed by reversing the sign of the canceller coefficients of $y_n$, and then adding $y_n$ with the received time-domain signal $r_n$.

The error processing block 202 transforms the time-domain error samples of error $e_n$ into frequency-domain error vector $E_k$ needed for adaptation. In one embodiment, the error processing block 202 performs the following functions: accumulate N samples of the time-domain error samples; construct a 2N data vector from an N error vector by appending N zeros to the N data vector; approximate the input vector by $\log_2$ approximation 222 (optional); and perform a 2N FFT (212) on the 2N data vector, resulting in a frequency-domain output error vector $E_k$. In one embodiment, the FFT 212 implementation is simpler due to the $\log_2$ approximation. In another embodiment, the FFT output vector is approximated by $\log_2$ approximation 222. The output of the error processing block 202 is fed into the least-means-square (LMS) Adaptation block 203.

In one embodiment, the $\log_2$ encoder 222 encodes an n-bit data in 2's complement into ceil($\log_2$(n))+sign bit output, where the ceil( ) function represents the ceiling integer. In sign exponent, the input data is converted into the form $\pm 2^M$, where M may range from 0 to ceil($\log_2$(n)). The zero value input is encoded as all zeros.

The following section provides an example of $\log_2$ approximation according to one embodiment. The encoding described herein has additional rounding operation. For example, for integer values, the approximation of $\log_2$ with rounding is given by:
Positive values from 0 to 15: 0 1 2 4 4 4 8 8 8 8 8 8 16 16 16 16
Negative values from −1 to −16: −1 −2 −4 −4 −4 −8 −8 −8 −8 −8 −8 −16 −16 −16 −16 −16

According to one embodiment, the $\log_2$ approximation may be implemented as follows. A 5-bit word is represented by: s, b4, b3, b2, b1. For positive numbers, except 0: it is represented as $+2^{(M-1)}$, and 0 is represented by 0. The first location is then determined as the first 1 from the left side. The location is marked M. If the following bit is 1, then M is equated to M+1. The word 0 is assigned special status, which is represented by M=0.

The above implementation of the embodiment can be illustrated by the following examples: For 01000, the first location of 1 is M=4. Since the following bit is 0, then M=4+0=4. It is represented by $2^{(M-1)}=2^{(4-1)}=+2^3$. For 00111, the first location of 1 is M=3. Since the following bit is 1, then M=3+1=4. It is represented by $2^{(M-1)}=2^{(4-1)}=+2^3$. For 00000, it is represented by M=0.

For negative numbers, the word is represented as $-2^{(M-1)}$. First, the number is converted to a positive number by taking one's complement of the negative number and adding 1 to it. Then the same process as for positive numbers is repeated for negative numbers. Second, the first location of 1 from the left side of the number is determined. The location is marked by M. If the following bit is 1, then M=M+1.

The above algorithm may be illustrated by the following examples. For 10100, one's complement and adding 1 to the complement results into 01100. The first location of 1 is M=4. Since the following bit is 1, M may be reassigned as M=4+1=5. The word is then represented by $-2^{(M-1)}=-2^{(5-1)}=-2^4$. For 10101, one's complement and adding 1 gives 01011. The first location of 1 in this example is M=4. Since the following bit is 0, M is reassigned as M=4+0=4. The word is then represented by $-2^{(M-1)}=-2^{(4-1)}=-2^3$. For values that are not integers, there is a known shift according to the location of the binary point. This known shift is not part of the log operation. Instead, the known shift is operated later via a simple shift.

Referring back to FIG. 2, the LMS adaptation block 203 takes the frequency-domain data vector $X_k$ and the error vector $E_k$ as inputs, along with the LMS step size vector μ and yields the updated frequency-domain coefficient vector $W_k$ that represents the echo. In one embodiment, all the vectors are of length 2N. The LMS adaptation block 203 computes the conjugate of the data vector $X_k$, referred to herein as $X^*_k$, and then computes the gradient by multiplying the frequency-domain error vector E(k) with the conjugate of the data vector $X^*_k$. Since $E_k$ may be approximated by $\log_2$, in one embodiment, the multipliers are implemented by shifts. The gradient vector is then scaled by the LMS step size vector p using multiplier 213. The LMS step size vector μ, in one embodiment, is chosen to be a power of half to simplify the multiplication operation of the multiplier 213 to a shift operation. The resulting gradient vector ΔW is then added to the previous coefficient vector $W_k$ using adder 233 to obtain the new coefficient vector $W_{k+1}$. The LMS adaptation described in this embodiment is performed in the frequency-domain. In one embodiment, the step size vector μ is time-varying and is performed via a gear shift process, where μ is a non-frequency-domain factor that changes over time.

Figure 3:
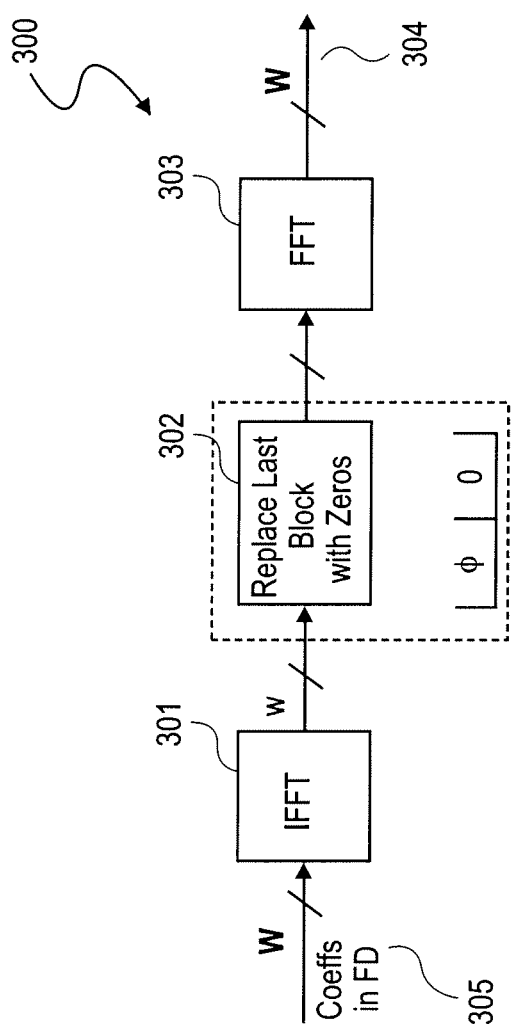
FIG. 3 is a top level and a detailed gradient constraint block, respectively, that operates on an echo or NEXT coefficient.

FIG. 3 provides a more detailed implementation of the gradient constraint (GC) block 201 according to one embodiment. GC may operate on a vector of coefficients W 305 or at least on a portion of the full weight vector W. In one embodiment, the full weight frequency-domain vector W 305 is converted into time-domain full weight vector, w, using Inverse Fast Fourier Transform (IFFT) block 301. The time-domain full weight vector is processed by replacing the last block by zeros before the time-domain vector is converted into frequency-domain full weight vector by the FFT block 303. The operation of gradient constraint does 'clearing operations' of wrap-around effects of cyclic correlation.

Returning back to FIG. 2, the multiplexer 243 selects between the new coefficient vector $W_{k+1}$ and the GC operated full weight vector $W_k$. A control signal (not shown) to the multiplexer 243 toggles between selecting the new coefficient vector $W_{k+1}$ which is then fed into the GC unit 201 via memory 253, and the GC operated full weight vector $W_k$ which is stored in memory 253 and then multiplied by 206 with frequency-domain 2N input vector $X_k$ from the input processing block 204. The order of operations is as follows:

1. The new coefficient vector $W_{k+1}$ is calculated via the LMS operation, where $W_{k+1}=W_k+\Delta W$.

2. The new updated coefficient vector $W_{k+1}$ is then processed by GC, and the GC output is then stored back into the memory 253.

3. A new LMS processing step is initiated. In some embodiments, GC operates at a slower rate than the LMS rate. For example, for every 8 LMS updates there is only one correction of GC to the coefficient vector W.

Regarding step 2 above, FIGS. 8-11 discussed later illustrate more embodiments of the GC operation that reduce the overall complexity and power consumption of the system because less hardware logic is needed.

In some embodiments, the length of the canceller does not match the input data block size i.e. M is not equal to N. In such embodiments, the data vector size N is determined by the overall complexity reduction and latency budget. As a result, the choice of data vector size N is independent of the choice of filter size M. Moreover, there is no reason to assume that they are dependent variables. Using the same N-tap architecture as shown in FIGS. 4A-D, any arbitrary filter can be implemented.

In one embodiment, the filter length M is larger than the data vector size N. To use the same N—tap architecture as the building block, the filter coefficients are divided into sections of N—the first section may consist of $w_1$ to $w_N$, and the next section may consist of $w_{N+1}$ to $w_{2N}$, and so forth. In one embodiment, the filter length M is equal to N.P, where there are P such partitions (sections). If M is not an integer multiple of N, then the coefficient vector is made an integer multiple of N by appropriate zero padding.

Figure 4A:
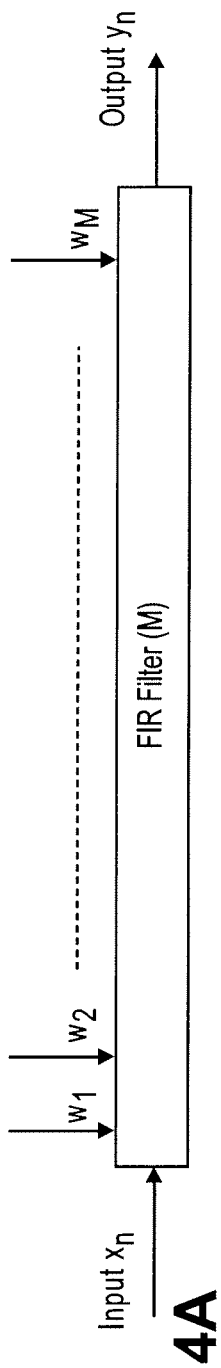
FIGS. 4A, 4B, 4C, and 4D are block architectures showing two time-domain and two frequency-domain FIR filter based echo cancellers of length M, respectively.
Figure 4B:
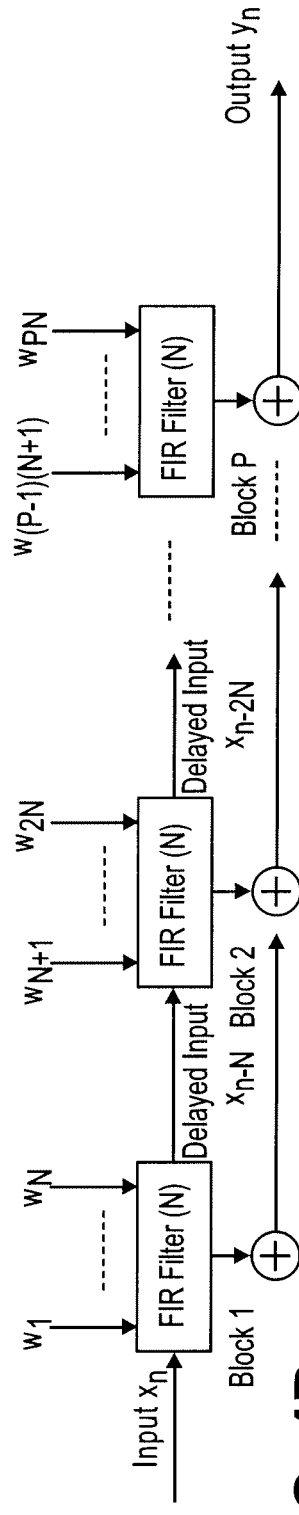
Figure 4C:
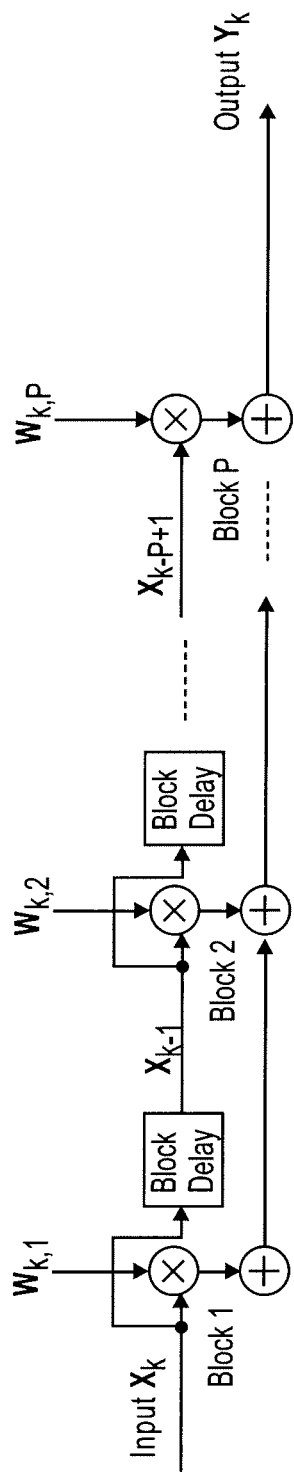

In one embodiment, error cancellation may be performed in the time-domain. In one embodiment, the M tap FIR filter is decomposed as P separate filters as shown in FIG. 4A and FIG. 4B with each filter comprising an N-tap section. FIG. 4A and FIG. 4B show a time-domain embodiment of a filter. In this embodiment, each section of the filter may be implemented as an N-tap filter. But the total filter length may still be M. The input to the sections, after the first section, is the delayed data samples that come from the previous section. The output of the individual sections is summed to obtain the final time-domain output $y_n$. The same idea can be performed in the frequency-domain as shown in FIG. 4C.

Figure 4D:
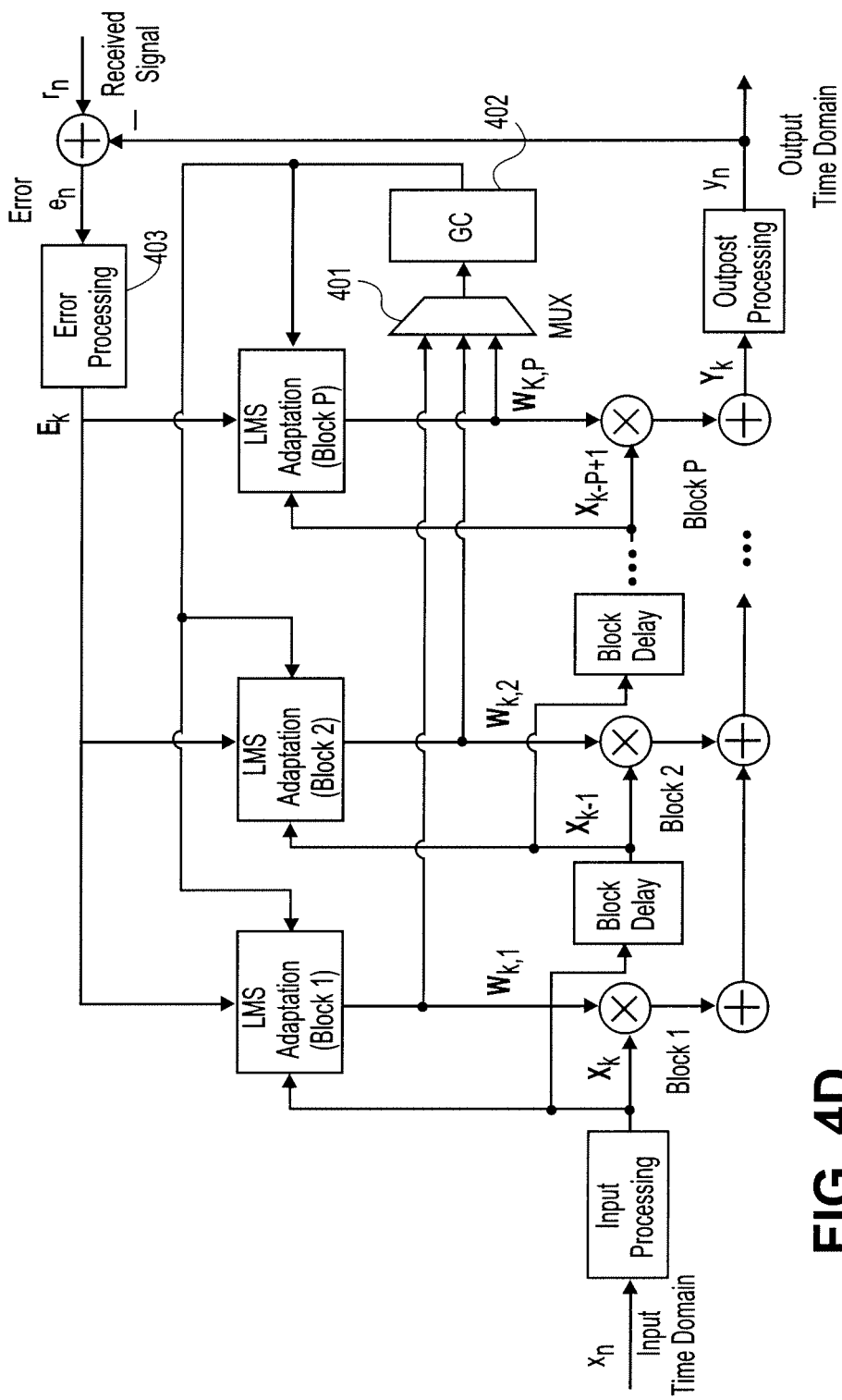

Using the partitioning approach presented above for filtering, an echo cancelling architecture, in one embodiment as shown in FIG. 4D, includes the data path filtering and the coefficient adaptation using the LMS adaptation blocks 1-P. The architecture in FIG. 4D comprises multiple sections, for example, four functional blocks, where each block contains some or all blocks shown in FIG. 2. As for coefficient adaptation, the error vector $E_k$ in frequency-domain, generated by the error processing unit 403, is common among all the sections (partitions) of FIG. 4D. In one embodiment, the structure of each section (partition) is identical, and hence, the same hardware block is used assuming that the precision requirements across the sections are the same. In one embodiment, a common gradient constraint unit 402 is used for all partitions. The multiplexer 401, in such an embodiment, selects output (vector coefficients) from the multiple LMS units and provides a selected coefficient to the common gradient constraint unit 402.

Figure 5:
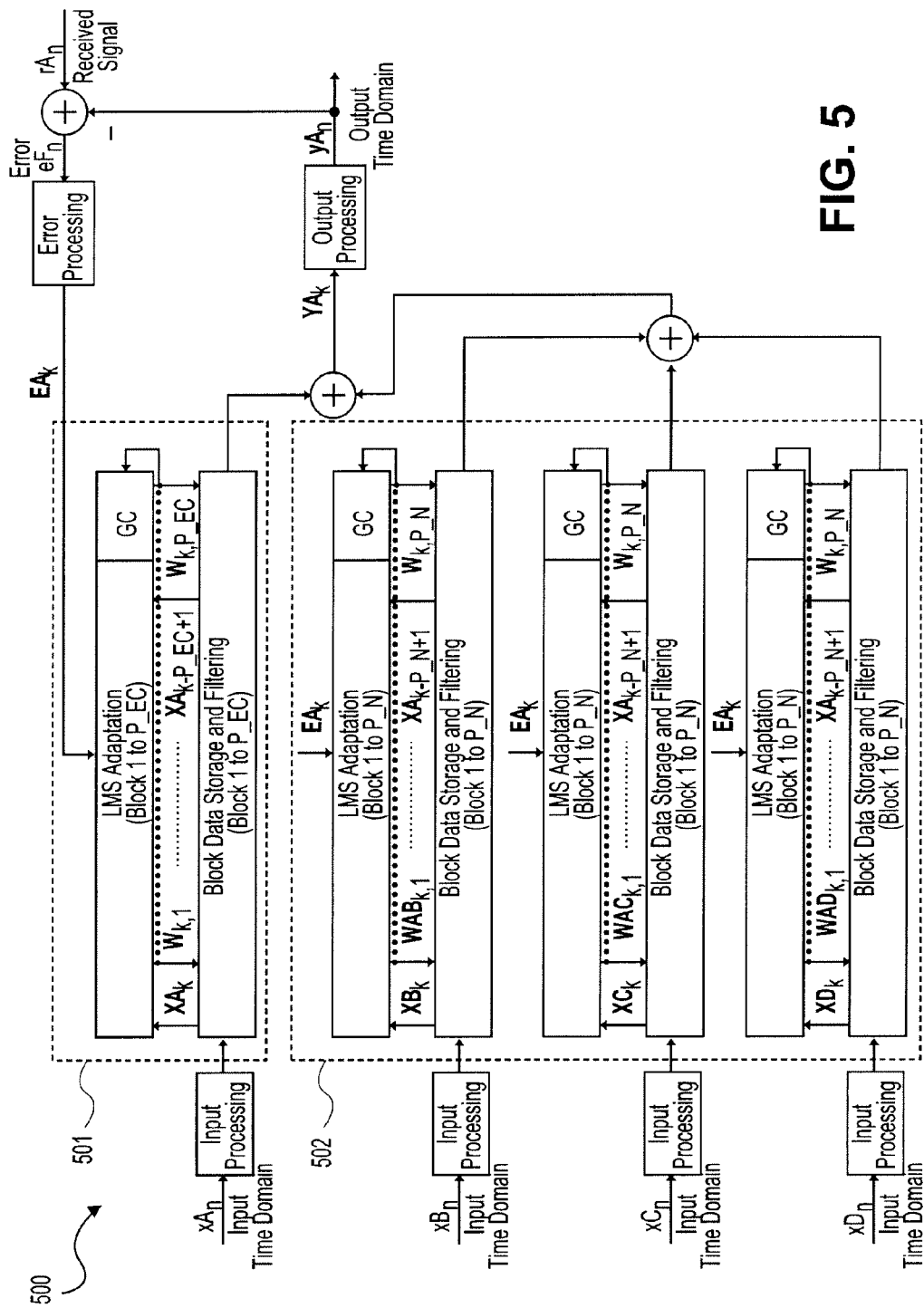
FIG. 5 is a frequency-domain echo and NEXT canceller for a pair according to one embodiment of the present invention.

FIG. 5 illustrates an echo 501 and NEXT 502 canceller according to one embodiment of the present invention. For illustrative purposes, four time-domain input signals are shown: $xA_n$, $xB_n$, $xC_n$, and $xD_n$. These input signals correspond to four transmit signals (not shown) being received by a receiver. Four sets of transformed vectors corresponding to the four sets of input signals are also shown.

The set $\{XA_k, XA_{k-1}, \ldots, XA_{k-P}\}$ are the transformed vectors and their delayed versions, respectively. The vectors for other pairs follow the same notational convention. The set $\{W_{k,1}, W_{k,2}, \ldots, W_{k,P\_EC}\}$ are the blocks of echo canceller coefficients each of size 2N, and there are P_EC such blocks for each canceller. In one embodiment, P_EC=8. In one embodiment, the set $\{WAB_{k,1}, WAB_{k,2}, \ldots, WAB_{k,P\_N}\}$ are blocks of NEXT canceller coefficients for pair-A caused by pair-B. In one embodiment, each block in the FDEN canceller is of size 2N, and there are P_N such blocks for each NEXT canceller. The coefficients for other pairs follow the same notational convention. In one embodiment, P_N=2. $YA_k$ is the frequency-domain output for pair-A that corresponds to the sum of all four cancellers-one Digital Error Canceller (DEC) and three Digital NEXT Canceller (DNC). The time-domain output $yA_n$ is the combined time-domain response. This time-domain output is subtracted from the pair-A time-domain received signal $rA_n$ using a subtractor. The output of the subtractor is the pair-A time-domain error signal $eA_n$. In one embodiment, an adder is implemented for the subtraction function by changing the sign of the time-domain output $yA_n$ before it is "summed" with the pair-A time-domain error signal $eA_n$. In one embodiment, $EA_k$ is the frequency-domain error vector that is used by all four cancellers for pair-A.

In one embodiment, as illustrated by FIG. 5, the total number of partitions per pair may be given by the following equation:

$$P\_EC + 3 \times P\_NC = 8 + 3 \times 2 = 14$$

In one embodiment, the canceller structures for all other three pairs mimics the structure for pair-A, and is identical to the structure shown in FIG. 4D with appropriate changes in the input and output signal sources.

As mentioned above, in one embodiment, the LMS update engine adapts coefficients in the frequency-domain. The LMS unit computes the conjugate of the data vector $X_k$ as $X^*_k$. The LMS unit may also compute the gradient by multiplying the frequency-domain error vector $E_k$ with the conjugate of the data vector $X^*_k$. In one embodiment, since $E_k$ is approximated by $\log_2$, the multipliers are implemented by shifts. The gradient vector is then scaled by the LMS step size vector $\mu$. In one embodiment, the step size $\mu$ is programmable by hardware or firmware and varies over time. The resulting gradient vector is then added to the previous coefficient vector to obtain the new coefficient vector.

In one embodiment, the conjugation operation requires sign reversal of the imaginary parts of $X_k$ and is implemented within the multiplication block that follows. In one embodiment, the multiplication of $X^*_k$ and $E_k$ requires 2N complex multipliers. Using symmetry, the number of multipliers may be reduced to N complex multiplications. In one embodiment, the multiplication function is implemented using shift registers because $E_k$ is approximated via $\log_2$. The 2N values in frequency-domain are symmetric because they result from transformation of real values. The first (dc) and the 129th (Nyquist) bins are real values, and the other frequency-domain values from 2 to 128 may be complex values.

In one embodiment, the frequency-domain vectors $X^*_k$ and $E_k$ have a zero-padded structure in time-domain, but the multiplication operation does not preserve the zero-padded structure. Since multiplication of two Discrete Fourier Transform (DFT) vectors in the frequency-domain may be equivalent to circular convolution in the time-domain, the output of the convolution is not guaranteed to have the zero padded structure in time-domain. As a result, to ensure that the update vector has a zero-padded structure, a gradient constraint operation is needed to enforce such a structure.

In one embodiment, as mentioned before, the step size $\mu$ of the LMS process is chosen to be a power of half. This simplifies the multiplication to only shift operations and thus saves power consumption of the overall system. The LMS vector can also have different 2N values and each of them can be chosen independently including the gear shifting, if desired. The choice of LMS step size vector $\mu$ affects the convergence speed and thus the final performance of the LMS process. In one embodiment, the LMS update engine for frequency-domain coefficients is functionally identical for all blocks, i.e. DEC and DNC. In another embodiment, the coefficient update operation comprises an addition of two complex numbers resulting in new coefficients that may be stored for the next update. The coefficient update operation can be summarized as:

$$W_{k+1} = W_k + \Delta W$$

$$W_{k+1} = W_k + \Delta W = W_k + \mu \cdot E_k \cdot X_k$$

Figure 6:
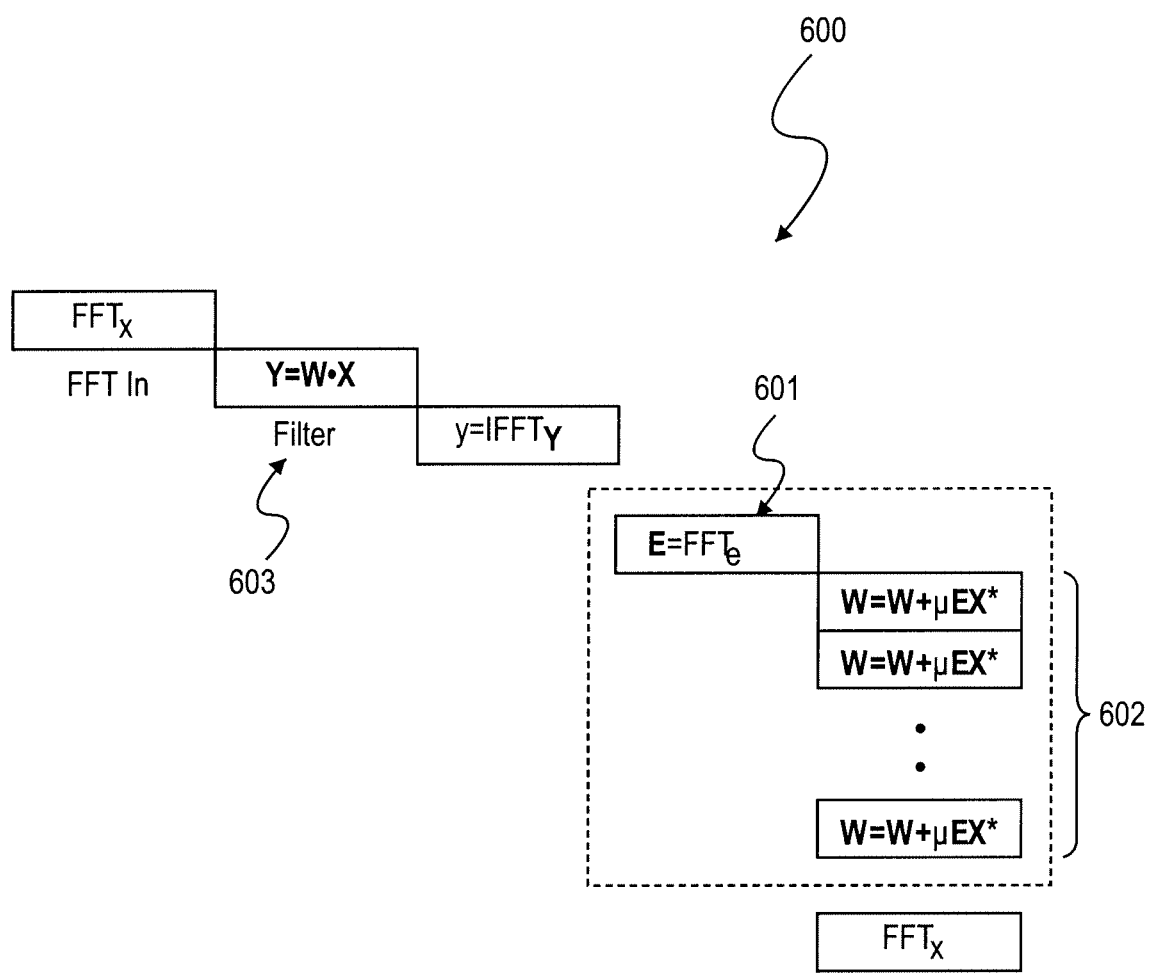
FIG. 6 is a least-means-square scheduler according to one embodiment of the present invention.

For simplification, the step size $\mu$ is the same value for all frequency bins. In one embodiment, the same $E_k$ may be used for all the partitions, as shown in FIG. 5 and by 601 in FIG. 6, that belong to the same pair. Since the multiplications in the LMS operation is simplified to shift operations, the coefficient updates are performed in parallel for all the partitions, as shown by 602 in FIG. 6. In 602, the vector W is updated for next filtering using 603. In FIG. 6, filter 603 corresponds to filtering for all partitions, where each partition needs N complex multipliers over N samples.

In one embodiment, the coefficient update is performed in every cycle during the initial convergence stage. In steady state mode, there may be a need to track only small drifts of the channel. Therefore, in order to save power consumption, the LMS operation can be set so that it performs periodically on each pair, and within one pair, the LMS operation is performed periodically on each partition.

For example, in one embodiment the error, $E_k$, in frequency-domain supports all the partitions of a pair. Thus, the steps per each cycle (of 128 clocks) can be: (a) get $E_k$, (b) perform LMS on the last partition, (c) perform LMS operation using the data, $X_k$, in the last partition for the last-1 partition coefficients where the data $X_k$ of the last-1 partition may move to the last partition, (d) perform LMS operation on the data $X_k$ in the last partition again for the coefficients of the last-2 partition etc., until the coefficients of the first partition, (e) disable the LMS operation of pair 1 and apply LMS operation for pair 2, then pair 3, and lastly for pair 4, (f) loop back to pair 1 and apply LMS operation to pair 1. In one embodiment, these steps are programmable by firmware. The present invention is not limited by the above set of steps. Instead, the above steps are a possible illustration of an LMS update operation.

In one embodiment, not all signals are available at the same time for processing. Except for some minor effect on latency, the processing delay should not affect the data path. However, for proper functionality as well as stability of the LMS engine, the update path depends on the exact delay match between the data vector $X_k$ and the error vector $E_k$. Since error computation happens at the end of all calculations, the error vector $E_k$ is available after certain processing delays and the data vectors $X_k$ used for the update is adjusted to accommodate this processing delay.

In one embodiment, the data path of the echo canceller needs more delay stages beyond the P_EC partitions to accommodate the processing delay of the error for the LMS operation. In one embodiment, in order to reduce the additional memory required for delaying $X_k$, the resolution for the data $X_k$ (for the extra delay) is reduced via $\log_2$ approximation. In one embodiment the $\log_2$ approximation employs rounding operation as explained above.

As mentioned above, GC is performed on the full weight vector $W_k$, or at least a portion of the full weight vector $W_k$, rather than $\Delta W$. In one embodiment, GC is applied periodically on the full weight vector $W_k$. In one embodiment, the GC operation is shared between all the partitions of all the pairs as shown in FIG. 4D. In one embodiment, the shared GC 402 outputs a constrained vector at a rate slower than the LMS output rate.

In one embodiment, each partition has N=128 time-domain coefficients (or 2N symmetric frequency-domain coefficients). The total number of partitions per lane, in one embodiment, is 14, where the echo canceller has 8 partitions and each NEXT canceller has 2 partitions, giving a total of 8+3×2=14 partitions per lane. The full frequency-domain canceller (FDC) has 14×4=56 partitions. Thus, the GC block can be very slow and, in one embodiment, use 50 cycles (each cycle may be 128 clocks of 800 MHz) to process one partition.

In one embodiment, GC update rate is programmable by firmware. A slower GC rate reduces system power consumption. GC update rate range correlates with the LMS rate. In one embodiment, the GC rate is slower than the LMS rate. In such a case, when the LMS rate is high, it affects the GC rate. For example, in one embodiment, when the LMS rate is reduced, the GC update rate is reduced as well. In another embodiment, GC updates, after some delay, causes previous LMS updates to be ignored and overwritten by the corrected old W.

As mentioned above, the GC operates on the full weight vector (i.e. full resolution of) $W_k$ or at least a portion of the full weight vector $W_k$. Thus, the FFT size may be quite large.

However, since there is plenty of time to do FFT and IFFT, the implementation of GC can be simplified significantly. Furthermore, since $W_k$ is real, FFT and IFFT implementation complexity may be reduced. For example, in one embodiment, a reduced complexity in design is achieved by implementing slower multipliers with fewer logic gates than the faster multipliers. For example, a multiplier can be implemented by adders. If speed is not an issue, multiplication can be done over longer time by reusing the same adder hardware for the multiplication procedure. Additionally, the implementation may be simplified significantly by sharing multipliers and even reusing the FFT for the IFFT operation. By simplifying the implementation, hardware and power savings are realized.

Figure 8:
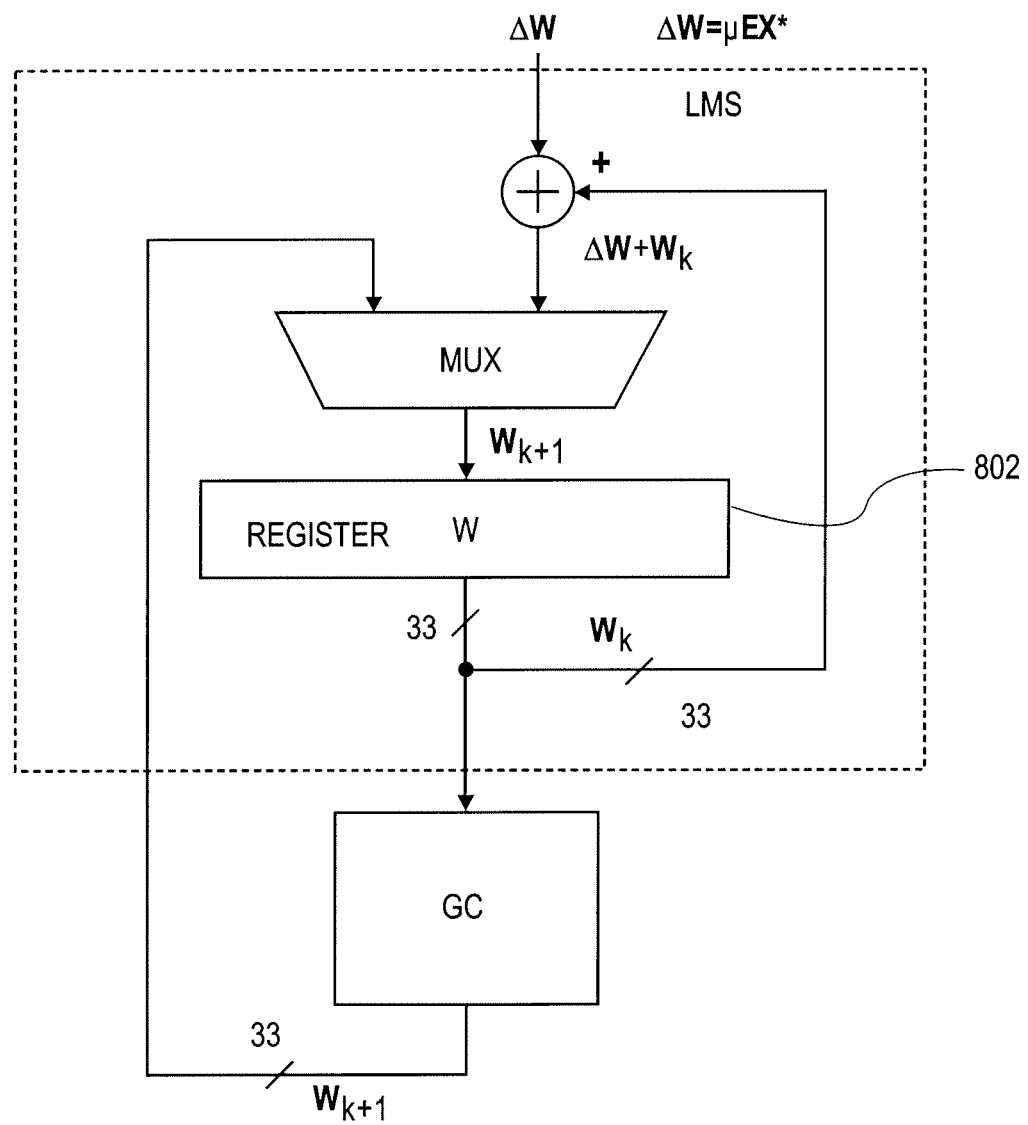
FIG. 8 is an implementation of operating gradient-constraint on a full weight vector according to one embodiment of the present invention.

FIG. 8 shows an implementation of GC operation on the full weight vector of $W_k$ according to one embodiment of the present invention. In parallel to the LMS process, the GC processes the full weight vector $W_k$ as illustrated by the following equation:

$$W_{k+1} = GC(W_k)$$

After the GC corrects the full weight vector $W_k$ according to its constraint, the coefficients $W_k$ are reloaded back into the appropriate registers 802. These registers now store the full weight vector $W_k$ that is periodically corrected by the GC block. The multiplexer in FIG. 8 toggles between the corrected or constrained full weight vector $W_{k+1}$ and the unconstrained sum $W_k + \Delta W$, where $\Delta W$ is the scaled gradient vector. The select signal of the multiplexer, select signal not shown in FIG. 8, selects the output of the GC block whenever the GC block generates a new constraint vector. So, register 802 is loaded with the most updated gradient constraint vector $W_{k+1}$.

In one embodiment, the corrected or constrained vector has priority over the unconstrained vector that is processed via the LMS unit, not shown in FIG. 8. In another embodiment, the LMS process is done more frequently than the GC process.

In one embodiment, GC processes 2N complex values, where N is equal to 128 resulting in 33 bits of corrected full weight vector $W_{k+1}$. In one embodiment, the GC operation is performed at equal or slower rates than the LMS rate. Slower rates of GC results into simpler implementation of the overall design shown in FIG. 2, and thus lower power consumption, because a lower GC rate means simpler and smaller multiplier logic hardware. In one embodiment, the GC rate is programmable by hardware or firmware.

Figure 9:
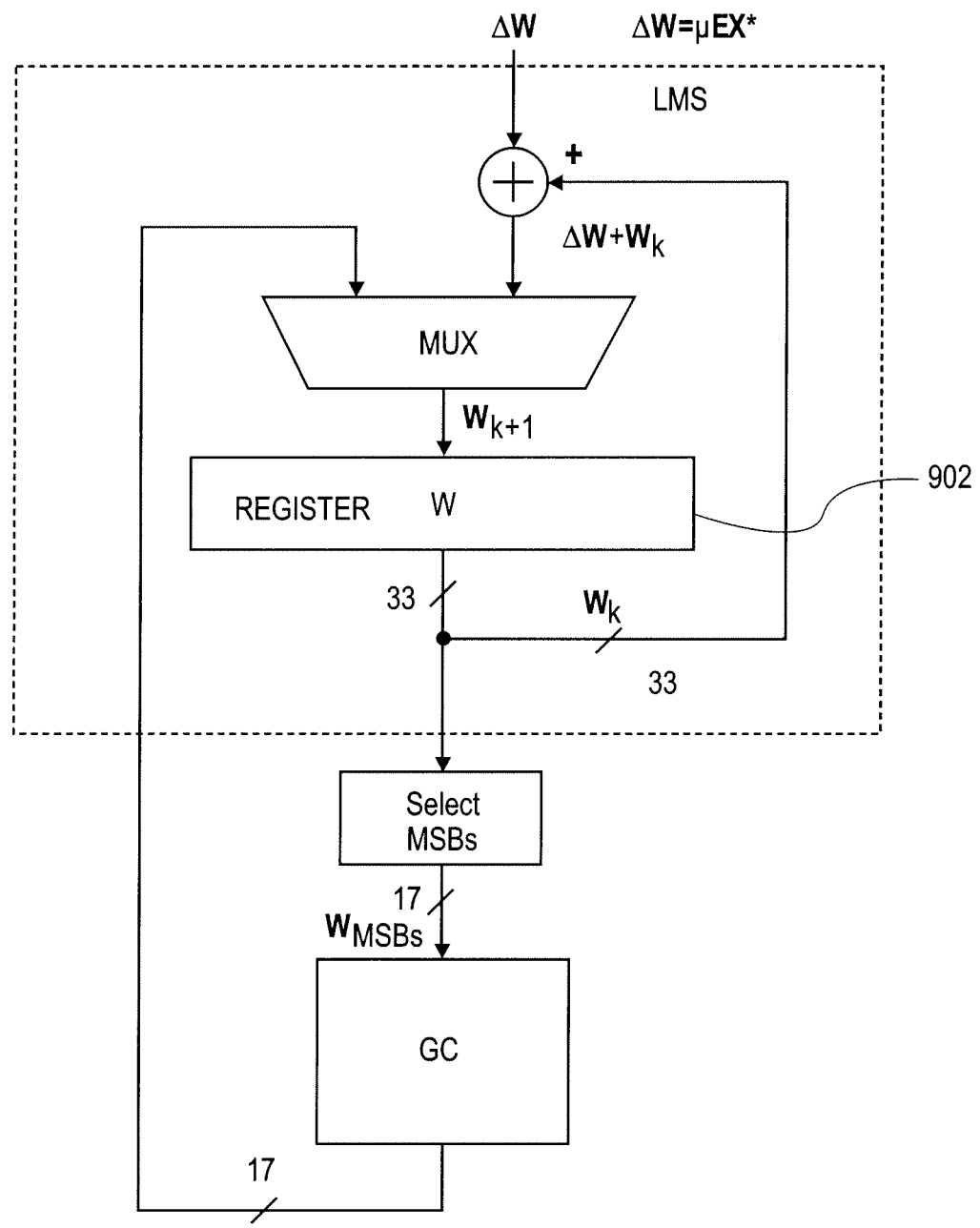
FIG. 9 is an implementation of operating gradient-constraint on selective most significant bits of a full weight vector according to one embodiment of the present invention.

In another embodiment, as shown in FIG. 9, GC is applied on at least a portion of the full weight vector $W_k$. For example, out of the 33 bits of the full weight vector $W_k$, only 17 most significant bits (MSBs) of $W_k$ are used for filtering. Applying GC operation on the MSBs of $W_k$ simplifies the GC operation over the embodiment in FIG. 8 because fewer bits are used in the GC operation than when the complete full weight vector is corrected. The following equation summarizes the GC operation in this embodiment:

$$W_{k+1}^{MSBs} = GC(W_k^{MSBs})$$

In one embodiment, MSBs of $W_k$ are used for the GC operation instead of the all the bits of the full weight vector. In one embodiment, 17 MSBs are used for the GC operation from a 33 bit wide full weight vector. By using MSBs of the full weight vector instead of the complete full weigh vector, the overall system implementation is simplified. For example, the GC block now processes 17 bits rather than 33 bits. Fewer the bits, the faster the GC process. The GC output, $W_{k+1}$, is reloaded back to the register 902 via the multiplexer. Like in the embodiment of FIG. 8, GC rate is a programmable rate and is usually set to a lower rate than the LMS rate. The multiplexer select signal, not shown in FIG. 9, performs the same way as the multiplexer in FIG. 8. The most updated constraint vector is stored in the register 902 because the multiplexer select signal selects the GC output whenever the GC block updates coefficient vector to provide a constrained vector.

In one embodiment, when the multiplexer selects GC output, the 17 bit output of the GC block is loaded into the 17 MSBs of the register 902. The remaining LSBs of the register 902 are not affected by the GC operation. In another embodiment, the LSBs of the register 902 can be padded with zeros or ones or a combination of both.

Figure 10:
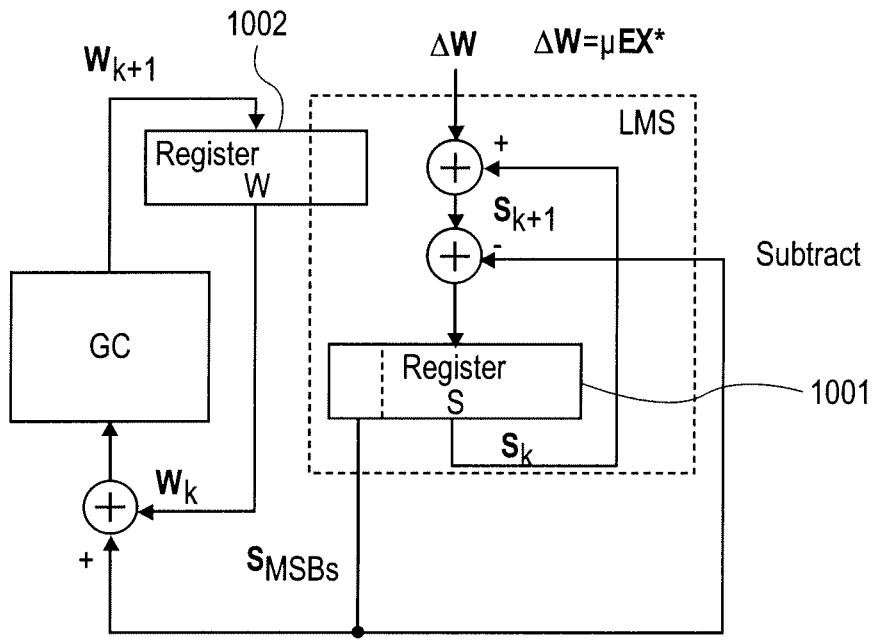
FIG. 10 is an implementation of operating gradient-constraint on the sum of frequency-domain full weight vector and the most significant bits of the sum of scaled gradient vectors.

FIG. 10 shows an alternative embodiment in which GC operates on the MSBs of the sum of $\Delta W$, stored in register 1001, and the full weight vector $W_k$. The following equation summarizes the operation in this embodiment:

$$W_{k+1} = GC(W_k + (\Sigma \Delta W)_{MSBs})$$

$$W_{k+1} = GC(W_k + S_{MSBs})$$

The portion of $S_k$, $S_{MSBs}$, that is summed with $W_k$, before applying the GC operation, is subtracted from $S_k$ during the LMS operation, as shown in FIG. 10. The number and selection of MSBs of $S_k$ that are used by the summation operation with $W_k$, is programmable by software or hardware.

In one embodiment, the rate at which the MSBs of $S_k$ are used to update $W_k$, i.e. $W_{k+1}$, and activate GC is also programmable by software or hardware. The complexity of the register 1002 reduces because MSBs of $S_k$ are used in the GC operation. This means the register 1002, in one embodiment, has a size corresponding to the number of MSBs of $S_k$ which is smaller than if all bits of $S_k$ were used by the GC operation. Moreover, the addition operation between the MSBs of $S_k$ and the previous constrained coefficient vector $W_k$ results in a simplified adder because the number of bits to add corresponds to the number of MSBs of $S_k$.

In one embodiment, the register 1002 has a size of 18 bits that corresponds to 18 MSBs of $S_k$. The GC operation in such an embodiment is less complex as compared to the GC operation on all bits of $S_k$ because the resolution of the input and output of the GC block is 18 bits.

In one embodiment, the GC update rate is slower than the LMS rate. Slower rates of GC results into simpler implementation of the overall design shown in FIG. 2, and thus lower power consumption. A lower GC rate means simpler and smaller multiplier logic hardware.

In FIG. 10, the register 1002 is shown to be partially within the LMS dotted line block. This is for illustrating that the MSBs of register 1001, in one embodiment, are compatible with the LSBs of the register 1002.

Each coefficient in FIG. 10 is split into two separate registers-register 1001 holds the LMS results while register 1002 holds the coefficients $W_k$ that are used for the filtering operation. The LMS operation updates $S_k$ as:

$$S_{k+1} = S_k + \Delta W$$

As noted above, the value of $S_{k+1}$ is reduced in the LMS unit by the MSBs of $S_k$ that are identified for the GC operation. If overflow occurs by the above operation because the value of $S_{k+1}$ exceeds the number of bits allocated to the register 1001, the S register 1001, in one embodiment, saturates or clips the value stored in the register 1001.

Figure 11:
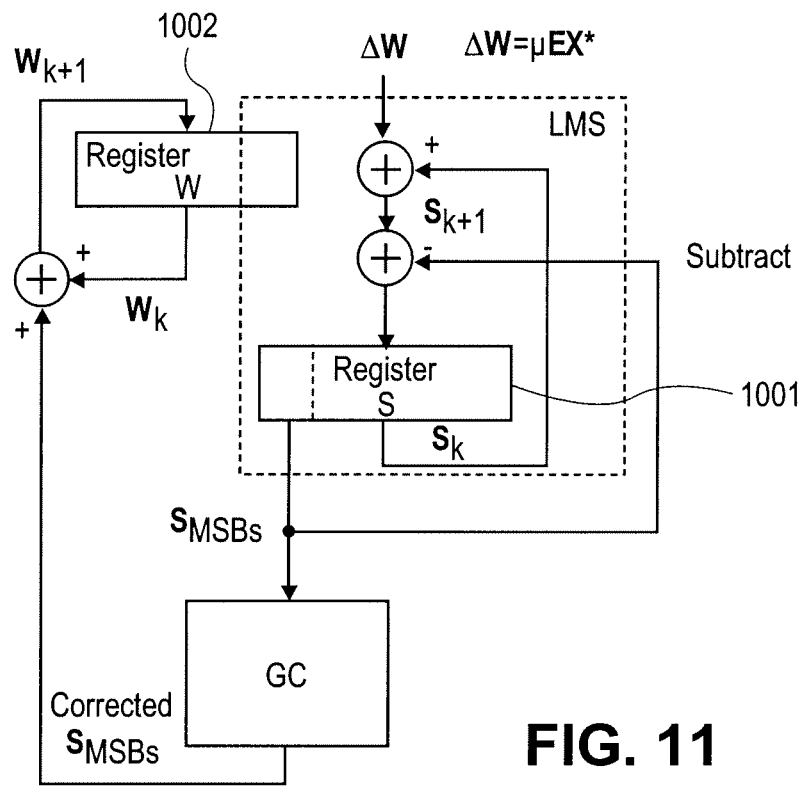
FIG. 11 is an implementation of operating gradient-constraint on most significant bits of the sum of scaled gradient vectors.

FIG. 11 illustrates another embodiment in which GC processes the MSBs of S. In reference to the previous embodiment illustrated by FIG. 10, this embodiment applies GC directly to the MSBs of $S_k$ and then sums the corrected MSBs of $S_k$ with the full weight vector $W_k$. Selection of MSBs of $S_k$ that are processed by the GC block is programmable by software or hardware. For example, in one embodiment 5 MSBs of $S_k$ are input to the GC block. The GC output is then summed with the coefficients $W_k$. $W_k$ is used for the filtering operation as:

$$W_{k+1} = W_k + GC(\Sigma \Delta W)_{MSBs}$$

$$W_{k+1} = W_k + GC(S_{MSBs})$$

The MSBs of $S_k$ that are processed by the GC block are subtracted from $S_k$ during the LMS operation. $S_k$ is updated by the LMS process as follows:

$$S_{k+1} = S_k + \Delta W$$

In one embodiment, the rate of processing the MSBs of $S_k$ by the GC block is programmable by software or hardware. For example, in one embodiment, there is one GC operation for two LMS operations. As mentioned before, a lower GC rate compared to the LMS rate reduces the implementation complexity.

In one embodiment, the number of bits for $W_k$ is 18 while the number of bits for $S_k$ is 18. Other number of bits can also be used depending on the filtering application.

While the invention has been described in conjunction with specific embodiments thereof, many alternatives, modifications and variations will be apparent to those of ordinary skill in the art in light of the foregoing description. For example, any filter structure could replace the described filters of the present invention. Accordingly, the invention is intended to embrace all such alternatives, modifications, and variations as to fall within the broad scope of the appended claims.

I claim:

1. A frequency-domain echo canceller comprising:
   an error processing unit configured to transform a time-domain (TD) error signal into a frequency-domain (FD) error signal;
   a gradient constraint unit configured to process at least a portion of a full weight vector;
   a least-mean-square (LMS) adaptation unit, coupled with the error processing unit and an output of the gradient constraint unit, configured to compute filter coefficients;
   a FD multiplier configured to multiply a FD input signal and the full weight vector to generate a FD output signal; and
   an output processing unit configured to transform the FD output signal to a TD output signal.

2. The frequency-domain echo canceller in claim 1, wherein the error processing unit comprises:
   a $\log_2$ encoder; and
   an append block coupled with the $\log_2$ encoder configured to append N zeros with N TD error signal samples to form a 2N TD error signal, and wherein the $\log_2$ encoder is configured to operate on the 2N TD error signal.

3. The frequency-domain echo canceller in claim 2, wherein the $\log_2$ encoder is configured to operate on the FD error signal that corresponds to the 2N TD error signal.

4. The frequency-domain echo canceller in claim 1, wherein the TD error signal corresponds to a difference between the TD output signal and a TD receive signal.

5. The frequency-domain echo canceller in claim 1, wherein the gradient constraint unit is configured to apply gradient constraint on all partitions.

6. The frequency-domain echo canceller in claim 1, wherein the LMS adaptation unit is configured to generate an unconstrained gradient vector by multiplying a conjugate of the FD input signal with the FD error signal.

7. The frequency-domain echo canceller in claim 6, wherein the unconstrained gradient vector is scaled by a step size vector which is time-varying via a programmable gear shift process.

8. The frequency-domain echo canceller in claim 7, wherein the full weight vector comprises a sum of the scaled unconstrained gradient vector and a previous coefficient.

9. The frequency-domain echo canceller in claim 7, wherein the gradient constraint unit is configured to apply gradient constraint to a sum of a portion of the sum of the unconstrained gradient vector and the full weight vector.

10. The frequency-domain echo canceller in claim 7, wherein the gradient constraint unit is configured to apply gradient constraint to a portion of the sum of the unconstrained gradient vector.

11. The frequency-domain echo canceller in claim 1, wherein the LMS adaptation unit further comprises a programmable LMS scheduler.

12. The frequency-domain echo canceller in claim 1, wherein the gradient constraint unit is configured to apply gradient constraint periodically on the full weight vector.

13. The frequency-domain echo canceller in claim 1, wherein the gradient constraint unit is configured to apply gradient constraint to a selected set of most significant bits (MSBs) of the full weight vector.

14. The frequency-domain echo canceller in claim 1, wherein the gradient constraint unit is configured to apply gradient constraint at a rate which is slower than an LMS rate.

15. The frequency-domain echo canceller in claim 14, wherein the gradient constraint unit is configured to apply gradient constraint at a programmable rate.

16. The frequency-domain echo canceller in claim 14, wherein the LMS rate is programmable.

17. A communication system with adaptive error correction comprising:
   an adaptive frequency-domain (FD) canceller with a gradient constraint unit configured to apply gradient constraint on at least a portion of a full weight vector resulting in a gradient constrained portion of the full weight vector;
   a least-mean-square (LMS) adaptation unit, coupled with the gradient constraint unit, the LMS adaptation unit including a multiplexer configured to select between the gradient constrained portion of the full weight vector, and a sum of the full weight vector and an unconstrained gradient vector; and
   a delay compensation unit configured to cancel a FD delay from the adaptive FD canceller.

18. The communication system in claim 17, wherein the gradient constraint unit is configured to apply gradient constraint at a programmable rate.

19. The communication system in claim 17, wherein the adaptive FD canceller comprises:
   an echo canceller configured to cancel echo from a communication channel; and
   a NEXT canceller, coupled with the echo canceller, configured to cancel echo from a neighboring communication channel.

20. The communication system in claim 17, further comprising:
   an equalizer configured to reduce convergence time; and
   a slicer coupled with the equalizer, wherein a time-domain (TD) error signal is fed into the adaptive FD canceller.

21. The communication system in claim 20, wherein the TD error signal is an output of the slicer, and wherein the output is fed into the adaptive FD canceller.

22. The communication system in claim 20, wherein the TD error signal is an input of the slicer, and wherein the input is fed into the adaptive FD canceller.

23. The communication system in claim 17, wherein the adaptive FD canceller further comprises one or more partitions corresponding to one or more input channels including:
   a data storage and filtering unit coupled to the LMS adaptation unit;
   wherein the LMS adaptation unit is configured to respond to the gradient constrained portion of the full weight vector of the one or more partitions.

24. The communication system in claim 23, wherein the LMS adaptation unit further comprises a programmable LMS scheduler.

25. The communication system in claim 23, wherein the LMS adaptation unit is configured to generate the unconstrained gradient vector by multiplying a conjugate of a FD input signal with a FD error vector.

26. The communication system in claim 25, wherein the unconstrained gradient vector is scaled by a step size vector which is time-varying via a gear shift process, and wherein the gear shift process is programmable.

27. The communication system in claim 26, wherein the full weight vector comprises a sum of the scaled unconstrained gradient vector and a previous coefficient.

28. The communication system in claim 17, wherein the adaptive FD canceller further comprises:
   an error processing unit configured to generate a corresponding FD error vector for one or more partitions of the adaptive FD canceller from a time-domain (TD) error signal that corresponds to a TD output signal and a TD receive signal; and
   an output processing unit configured to transform a FD output signal from the one or more partitions to the TD output signal, wherein the FD output signal is generated by the data storage and filtering unit and the LMS adaptation unit.

29. The communication system in claim 28, wherein the output processing unit is configured to receive sums of the FD output signals from the data storage and filtering unit of one or more partitions of a NEXT canceller and an echo canceller.

30. The communication system in claim 28, wherein the FD error vector is configured to the one or more partitions of the communication system.

31. The communication system in claim 28, wherein the error processing unit comprises:
   a $\log_2$ encoder; and
   an append block coupled with the $\log_2$ encoder, wherein the append block is configured to append N zeros with N TD error signal samples to form a 2N TD error signal, and wherein the $\log_2$ encoder is configured to operate on the 2N TD error signal and the corresponding FD error vector.

32. The communication system in claim 28, wherein the TD error signal corresponds to a difference between the TD output signal and the TD receive signal.

33. The communication system in claim 17, wherein the adaptive FD canceller is in a receiver, and wherein the delay compensation unit is in a transmitter configured to operate on a transmitted signal.

34. A method to cancel echo in a communication system comprising:
   applying a least-mean-square (LMS) adaptation algorithm, by a processing unit, to a frequency-domain (FD) error signal to generate a scaled FD gradient vector corresponding to coefficients of the FD error signal;

applying gradient constraint, by the processing unit, on at least a portion of a full weight vector of the scaled FD gradient vector to generate a FD gradient constraint vector; and multiplying, by the processing unit, the FD gradient constraint vector with a FD input signal based on a shifting algorithm to generate a FD output signal with cancelled echo.

35. The method in claim 34, further comprising processing a time-domain (TD) input signal that is transformed into the FD input signal.

36. The method in claim 34, further comprising generating a time-domain (TD) error signal from a TD receive signal and a TD output signal, wherein the TD error signal is transformed into a FD error signal, and wherein the TD output signal is generated by transforming the FD output signal.

37. The method in claim 36, further comprising encoding the TD error signal and the FD error signal with $\log_2$ approximation.

38. The method in claim 36, wherein the TD error signal corresponds to a difference between the TD output signal and the TD receive signal.

39. The method in claim 34, further comprising scaling the scaled FD gradient vector by a step size vector which is time-varying via a gear shift process.

40. The method in claim 39, wherein the full weight vector comprises a sum of the scaled FD gradient vector and a previous coefficient.

41. The method in claim 34, wherein the LMS adaptation unit further comprises a programmable LMS scheduler.

42. The method in claim 34, wherein the gradient constraint is applied on the full weight vector.

43. The method in claim 34, wherein the gradient constraint unit applies gradient constraint at a programmable rate.

44. The method in claim 43, wherein the programmable rate is slower than an LMS rate.

45. The method in claim 44, wherein the LMS rate is programmable.

46. The method in claim 34, wherein the gradient constraint unit applies gradient constraint to a sum of a portion of a sum of the scaled FD gradient vector and the full weight vector.

47. The method in claim 34, wherein the gradient constraint unit applies gradient constraint to a portion of the sum of the scaled FD gradient vector.

48. A frequency-domain echo canceller comprising:
a gradient constraint unit configured to process at least a portion of a full weight vector; and
a least-mean-square (LMS) adaptation unit, coupled with the gradient constraint unit, the LMS adaptation unit including a multiplexer configured to select between the processed full weight vector and a sum of the full weight vector and a gradient vector.

49. The frequency-domain echo canceller in claim 48, wherein the portion of the full weight vector includes most significant bits (MSBs) of the full weight vector.

50. The frequency-domain echo canceller in claim 48, wherein the gradient vector is a scaled frequency-domain (FD) gradient vector and the LMS adaptation unit is configured to periodically sum the scaled FD gradient vector and the full weight vector.

51. The frequency-domain echo canceller in claim 48, wherein the gradient constraint unit is configured to periodically apply gradient constraint to the portion of the full weight vector comprising most significant bits of the full weight vector.

52. The frequency-domain echo canceller in claim 48, wherein the gradient constraint unit is configured to apply gradient constraint at a rate which is slower than an LMS rate, and wherein both rates are programmable.

53. The frequency-domain echo canceller in claim 48, wherein the gradient constraint unit is configured to apply gradient constraint to a complete full weight vector.

54. A frequency-domain echo canceller comprising:
a gradient constraint unit configured to process at least a portion of a sum of scaled gradient vectors and to apply a gradient constraint to the portion of the sum of the scaled gradient vectors to generate a corrected portion of the sum of the scaled gradient vectors; and
a least-mean-square (LMS) adaptation unit, coupled with the gradient constraint unit, configured to compute filter coefficients based on the sum of the scaled gradient vectors.

55. The frequency-domain echo canceller in claim 54, wherein the gradient constraint unit is configured to periodically apply a gradient constraint to a sum of the portion of the sum of the scaled gradient vectors and a full weight vector.

56. The frequency-domain echo canceller in claim 54, wherein the corrected portion of the sum of the scaled gradient vectors includes selected most significant bits of the summed vector.

57. The frequency-domain echo canceller in claim 54, wherein the corrected portion of the sum of the scaled gradient vectors is periodically summed with a full weight vector.

58. The frequency-domain echo canceller in claim 54, wherein the LMS adaptation unit is configured to periodically sum the sum of the scaled gradient vectors and the scaled gradient vector to generate an intermediate scaled gradient vector.

59. The frequency-domain echo canceller in claim 58, wherein the LMS adaptation unit is configured to periodically subtract the portion of the sum of the scaled gradient vectors and the intermediate scaled gradient vector to generate input for the gradient constraint unit.

60. The frequency-domain echo canceller in claim 54, wherein the gradient constraint unit is configured to apply gradient constraint at a rate which is slower than an LMS rate, and wherein both rates are programmable.

* * * * *